(12) United States Patent
Banerjee et al.

(10) Patent No.: US 12,040,014 B2
(45) Date of Patent: Jul. 16, 2024

(54) CONFIGURABLE RESISTIVITY FOR LINES IN A MEMORY DEVICE

(71) Applicant: Micron Technology, Inc., Boise, ID (US)

(72) Inventors: Koushik Banerjee, Milpitas, CA (US); Isaiah O. Gyan, Albuquerque, NM (US); Robert Cassel, Lehi, UT (US); Jian Jiao, Albuquerque, NM (US); William L. Cooper, Lehi, UT (US); Jason R. Johnson, American Fork, UT (US); Michael P. O'Toole, Salt Lake City, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/970,756

(22) Filed: Oct. 21, 2022

(65) Prior Publication Data
US 2023/0114440 A1 Apr. 13, 2023

Related U.S. Application Data

(62) Division of application No. 16/781,975, filed on Feb. 4, 2020, now Pat. No. 11,495,293.

(51) Int. Cl.
*G11C 11/00* (2006.01)
*G11C 13/00* (2006.01)

(52) U.S. Cl.
CPC ........ *G11C 13/003* (2013.01); *G11C 13/0004* (2013.01); *G11C 13/0007* (2013.01);
(Continued)

(58) Field of Classification Search
CPC ............ G11C 13/0004; G11C 13/0007; G11C 13/0026; G11C 13/0028; G11C 2213/71; H10B 63/84
See application file for complete search history.

(56) References Cited

U.S. PATENT DOCUMENTS 7,042,066 B2  5/2006  Hsu et al.
8,467,219 B2  6/2013  Lue
(Continued)

FOREIGN PATENT DOCUMENTS

JP  08-306883 A   11/1996
JP  2019-536260 A  12/2019
(Continued)

OTHER PUBLICATIONS

International Search Report and Written Opinion received for PCT Patent Application No. PCT/US21/12301, mailed on May 3, 2021, 7 pages.
(Continued)

*Primary Examiner* — Uyen Smet
(74) *Attorney, Agent, or Firm* — Holland & Hart LLP

(57) ABSTRACT

Methods, systems, and devices supporting configurable resistivities for lines in a memory device, such as access lines in a memory array are described. For example, metal lines at different levels of a memory device may be oxidized to different extents in order for the lines at different levels of the memory device to have different resistivities. This may allow the resistivity of lines to be tuned on a level-by-level basis without altering the fabrication techniques and related parameters used to initially form the lines at the different levels, which may have benefits related to at least reduced cost and complexity. Lines may be oxidized to a controlled extent using either a dry or wet process.

17 Claims, 8 Drawing Sheets

(52) U.S. Cl.
CPC ...... *G11C 13/0026* (2013.01); *G11C 13/0028* (2013.01); *G11C 13/004* (2013.01); *G11C 13/0069* (2013.01); *G11C 2213/71* (2013.01); *G11C 2213/79* (2013.01)

(56) References Cited

U.S. PATENT DOCUMENTS

| | | |
|---|---|---|
| 2008/0258203 A1 | 10/2008 | Happ et al. |
| 2009/0001342 A1* | 1/2009 | Schricker ............. H10N 70/041 |
| | | 438/151 |
| 2014/0284697 A1 | 9/2014 | Wang et al. |
| 2017/0077184 A1 | 3/2017 | Kikuchi et al. |
| 2018/0114720 A1 | 4/2018 | Wang et al. |
| 2019/0006386 A1 | 1/2019 | Yamazaki et al. |
| 2019/0123262 A1 | 4/2019 | Lee et al. |
| 2019/0326357 A1 | 10/2019 | Castro et al. |
| 2021/0013093 A1 | 1/2021 | Wang et al. |
| 2021/0020236 A1* | 1/2021 | Baek .................. G11C 13/0026 |
| 2021/0036145 A1 | 2/2021 | Lin et al. |
| 2022/0051984 A1 | 2/2022 | Wei et al. |

FOREIGN PATENT DOCUMENTS

| | | |
|---|---|---|
| KR | 10-2014-0040675 A | 4/2014 |
| TW | 200403813 A | 3/2004 |
| TW | 201332087 A | 8/2013 |
| TW | 201735270 A | 10/2017 |

OTHER PUBLICATIONS

Taiwan Intellectual Property Office, "Office Action," issued in connection with ROC (Taiwan) Patent Application No. 110100957, dated Sep. 7, 2021 (3 pages).

Japan Patent Office, "Office Action," issued in connection with Japan Patent Application No. 2022-547178 dated Nov. 28, 2023 (6 pages) (3 pages of English Translation and 3 pages of Original Document).

European Patent Office, "Supplementary European search report and Search Opinion", issued in connection with European Patent Application No. 21750001.6 dated Jun. 27, 2023 (5 pages).

* cited by examiner

CONFIGURABLE RESISTIVITY FOR LINES IN A MEMORY DEVICE

CROSS REFERENCE

The present Application for Patent is a divisional of U.S. patent application Ser. No. 16/781,975 by Banerjee, et al., entitled "CONFIGURABLE RESISTIVITY FOR LINES IN A MEMORY DEVICE", filed Feb. 4, 2020, which is assigned to the assignee hereof, and which is expressly incorporated by reference in its entirety herein.

BACKGROUND

The following relates generally to memory devices and more specifically to configurable resistivity of lines a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
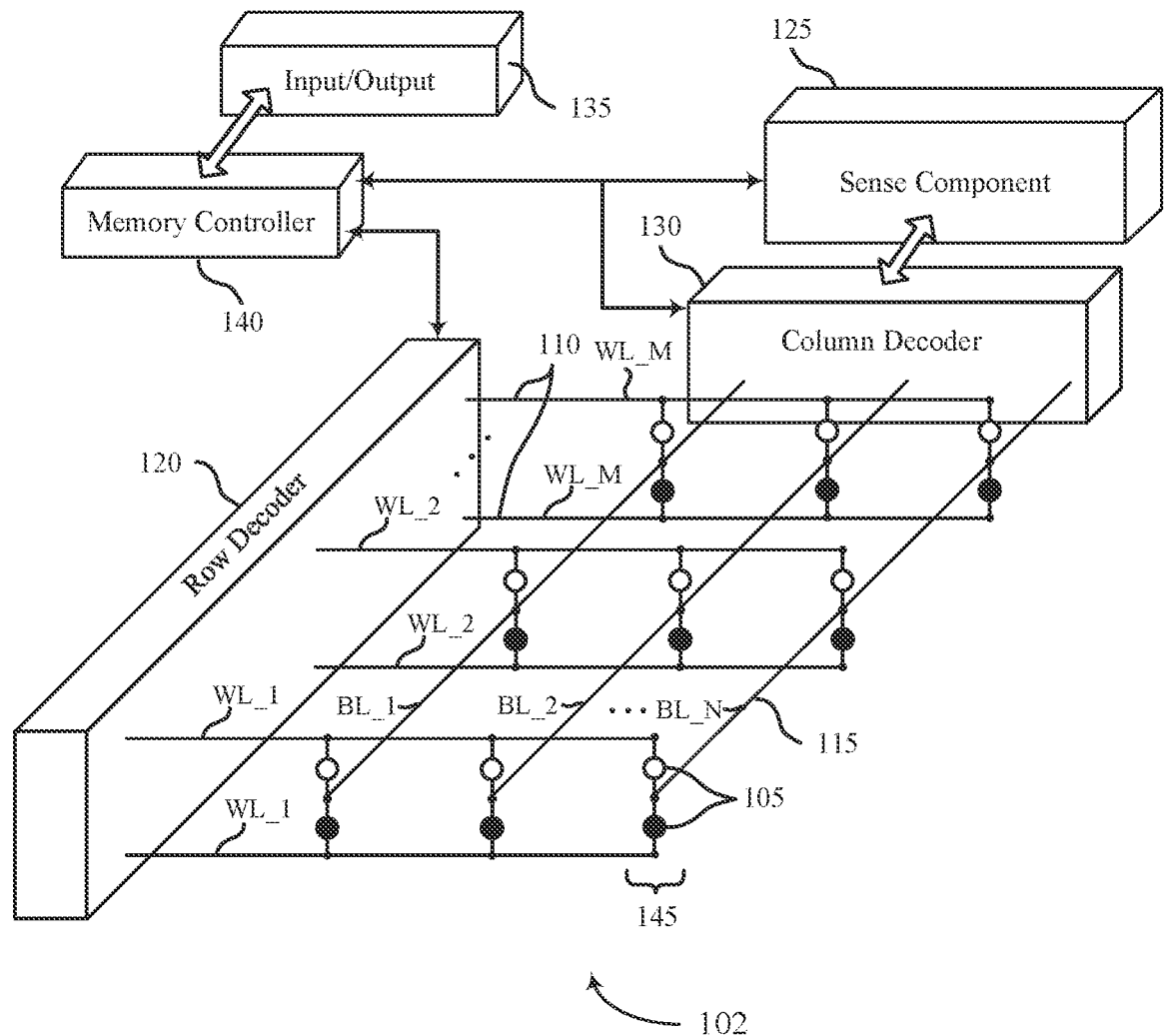
FIG. 1 illustrates an example memory device that supports configurable resistivity for lines in a memory array in accordance with examples as disclosed herein.

Accessing a memory cell (e.g., during a read or write operation) may include applying a non-zero voltage across the memory cell in order to either read (e.g., sense) a logic state stored by the memory cell or write (e.g., program) the memory cell to store a desired logic state. Memory cells within an array may be coupled with and located at the intersection of different access lines, and thus accessing a memory cell may include applying respective voltages to the different access lines coupled with the memory cell. Each access lines may be coupled with a corresponding driver (e.g., by one or more vias or other interconnects, with the drivers located outside the array), and the distance of the current path (signal path) between a memory cell and the driver for the access line may be referred to as the electrical distance (ED) for the memory cell, at least in the context of that access line or driver.

Memory cells with a relatively large ED may be referred to as far memory cells, and memory cells with a relatively small ED may be referred to as near memory cells. Within an array, multiple memory cells may be coupled with each individual access line. For example, memory cells may be arranged as rows and columns, with each row of memory cells coupled with a corresponding row line (which may also be called a word line) and each column of memory cell coupled with a corresponding column line (which may also be called a digit line or bit line).

With respect to far memory cells coupled with an access line, configuring the access line to have a relatively low resistivity may be desirable. A relatively low resistivity for the access line may, for example, reduce the amount of drive current required to access the far memory cells. With respect to near memory cells, however, configuring the access line to have a relatively high resistivity may be desirable. A relatively high resistivity for the access line may, for example, reduce the severity (amplitude, magnitude) of current spikes (e.g., transient currents) through near memory cells when the near memory cells are accessed (e.g., due to charge built up in parasitic capacitances within the array, which may discharge through the memory cell when the memory cell is placed in conductive state) and thereby prolong the lifetime (reduce wearout) of the near memory cells. Thus, for a given access line, a desired (target) resistivity may be determined as a compromise (intermediate, middle-ground, sweet spot) value based on competing considerations for far and near memory cells coupled with the access line.

Some memory arrays may include multiple levels of access lines. For example, each deck of memory cells may include a set of memory cells arranged as a two-dimensional (2D) array (e.g., arranged into rows and columns within a plane), and multiple decks of memory cells may be fabricated or otherwise arranged (e.g., stacked) on top of one another. Additionally or alternatively, within the context of a single deck of memory cells, some access lines may be located underneath the memory cells of the deck while other access lines may be located above the memory cells of the deck. The desired resistivity of an access line may depend on the level of the memory array at which the access line is located, as access lines at different levels may be located at different distances, and thus different EDs, from their corresponding drivers. For example, if drivers are located underneath the array, access lines at a higher level of the array may be further from their corresponding drivers than access line at a lower level of the array. Thus, in such an example, the minimum and maximum EDs for memory cells coupled with a higher access line will be increased relative to the minimum and maximum EDs for memory cells coupled with a lower access line. Additionally, multi-level arrays may be susceptible to variations or defects as aspects of different decks may be fabricated independently, and parasitic capacitances associated with the array and related issues associated with transient currents may become more severe as the number of levels in the array increases.

In view of the foregoing, or for other reasons that may be appreciated by one of ordinary skill in the art, it may be desirable to configure (tune) the access lines at different levels of a memory array to have different resistivities (e.g., for access lines at a higher level of the array to have lower resistivities than access lines at a lower level of the array, to compensate for the access lines at the higher level being further from associated drivers). Due to cost, complexity, or other considerations, however, it may also be desirable to fabricate access lines at different levels of a memory array using a same material and with the same initial target dimensions. For example, varying the initially-formed cross-sectional area (e.g., width or height, thickness) of access lines at different layers may provide various performance benefits but may also have associated cost- or complexity-related drawbacks.

As described herein, however, different access lines at different levels of a memory array may be configured (adjusted, tuned) to have different resistivities based on oxidizing access lines at different levels to different extents. For example, access lines at different levels of the array may be initially formed to have the same resistivity as one another (e.g., same material, same thickness)—and thus the same fabrication processes may be used at both levels with respect to access line formation—but access lines at one level may be oxidized to a greater extent than access lines at another level such that the more heavily oxidized access lines have a higher resistivity. Oxidation may be accomplished using wet or dry techniques, for example, and the resistivity of access lines at a given level may be configured (controlled, adjusted, tuned) based on controlling the extent of oxidation.

Features of the disclosure are initially described in the context of example memory arrays as described with reference to FIGS. 1 and 2. These and other features of the disclosure are further illustrated by and described with reference to various process flows and flowcharts as described with reference to FIGS. 3-8.

FIG. 1 illustrates an example memory device 100 that supports configurable resistivities for lines in a memory device in accordance with examples as disclosed herein. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, and not necessarily actual physical positions within the memory device 100. Further, although some elements included in FIG. 1 are labeled with a numeric indicator, other corresponding elements are not labeled though they are the same or would be understood to be similar, in an effort to increase visibility and clarity of the depicted features.

In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1, and thus to store one bit of information. In some examples, a memory cell 105 may be configured to store one of more than two logic states, and thus to store more than one bit of information.

The 3D memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two decks (levels) of memory cells 105 and may thus be considered a 3D memory array; however, the number of decks is not limited to two and may in some cases be one or more than two. Each deck may be aligned or positioned so that memory cells 105 within one deck may be aligned (exactly, overlapping, or approximately) with memory cells of another deck, forming memory cell stacks 145.

A memory cell 105 may, in some examples, be a self-selecting memory cell, a phase change memory (PCM) cell, and/or another type of resistive or threshold-based memory cell. A self-selecting memory cell 105 may include one or more components of a material (e.g., a chalcogenide material) that each function both as a storage element and as a cell selector (selection) element, thereby eliminating the need for separate cell selector circuitry (a selector circuitry that does not contribute to storage). Such an element may be referred to as a storage and selector component (or element), or as a self-selecting memory component (or element). In contrast, other types of memory cells, such as dynamic random access memory (DRAM) or PCM cells, may each include a separate (dedicated) cell selector element such as a three-terminal selector element (e.g., a transistor) or two-terminal selector element (e.g., a diode) to contribute to the selection or non-selection of the memory cell without contributing to the storage of any logic state.

Memory array 102 may include multiple word lines 110 (e.g., row lines) for each deck, labeled WL_1 through WL_M, and multiple bit lines 115 (e.g., column lines), labeled BL_1 through BL_N, where M and N depend on the array size. In some examples, each row of memory cells 105 is connected to a word line 110, and each column of memory cells 105 is connected to a bit line 115. In some cases, word lines 110 and bit lines 115 may generically be referred to as access lines because they may permit access to memory cells 105. In some examples, word lines 110 may also be known as row lines 110, and bit lines 115 may also be known as digit lines 115 or column lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively doped semiconductors, or other conductive materials, alloys, compounds, or the like.

Word lines 110 and bit lines 115 may be substantially perpendicular (i.e., orthogonal) to one another or otherwise intersect one another to create an array of memory cells. As shown in FIG. 1, the two memory cells 105 in a memory cell stack 145 may share a common conductive line, such as a bit line 115. That is, a bit line 115 may be in electronic communication with the bottom electrode of the upper memory cell 105 and the top electrode of the lower memory cell 105 of the memory cell stack 145. Other configurations may be possible, for example, a third deck (not shown) may share an access line 110 with the lower illustrated deck or the upper illustrated deck. In general, one memory cell 105 may be located at the intersection of two conductive lines such as a word line 110 and a bit line 115. This intersection may be referred to as an address of a memory cell 105. A target memory cell 105 may be a memory cell 105 located at the intersection of an energized word line 110 and bit line 115; that is, word line 110 and bit line 115 may be energized to read, write, or otherwise access a memory cell 105 at their intersection. Other memory cells 105 that are in electronic communication with (e.g., connected to) the same word line 110 or bit line 115 may be referred to as untargeted memory cells 105.

Electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include multiple self-selecting or other memory components (e.g., a selection component and a storage component) separated from each other and from access lines 110, 115 by electrodes. As previously noted, for self-selecting memory cells 105, a single component (e.g., a section or layer of chalcogenide material within the memory cell 105) may be used as both a storage element (e.g., to store or contribute to the storage of a state of memory cell 105) and as a selector element (e.g., to select or contribute to the selection of the memory cell 105).

The electrodes within a memory cell stack 145 may each be of a same material (e.g., carbon) or may be of various (different) materials. In some cases, the electrodes may be a different material than the access lines. In some examples, the electrodes may shield a material (e.g., a chalcogenide material) included in a self-selecting or other memory component from the word line 110, from the bit line 115, and from each other to prevent chemical interaction between the material and the word line 110, the bit line 115, or another memory component.

Operations such as reading and writing may be performed on memory cells 105 by activating or selecting a corresponding word line 110 and bit line 115. Accessing memory cells 105 may be controlled through a row decoder 120 and a column decoder 130. For example, a row decoder 120 may receive a row address from the memory controller 140 and activate the appropriate word line 110 based on the received row address. Such a process may be referred to as decoding a row or word line address. Similarly, a column decoder 130 may receive a column address from the memory controller 140 and activate the appropriate bit line 115. Such a process may be referred to as decoding a column or bit line address. A row decoder 120 and/or column decoder 130 may be examples of decoders implemented using decoder circuitry, for example. In some cases, row decoder 120 and/or column decoder 130 may include charge pump circuitry that is configured to increase a voltage applied to a word line 110 or bit line 115 (respectively).

A memory cell 105 may be read (e.g., sensed) by a sense component 125 when the memory cell 105 is accessed (e.g., in cooperation with the memory controller 140, row decoder 120, and/or column decoder 130) to determine a logic state stored by the memory cell 105. The sense component 125 may provide an output signal indicative of (e.g., based at least in part on) the logic state stored by the memory cell 105 to one or more components (e.g., to the column decoder 130, the input/output component 135, the memory controller 140). In some examples, the detected logic state may be provided to a host device (e.g., a device that uses the memory device 100 for data storage, a processor coupled with the memory device 100 in an embedded application), where such signaling may be provided directly from the input/output component 135 or via the memory controller 140.

Sense component 125 may include various transistors or amplifiers to detect and amplify a difference in signals obtained based on reading a memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. A person of ordinary skill in the art will appreciate that sense component may be associated either with column decoder or row decoder without losing its functional purpose.

Though illustrated to the side of the memory array 102 for clarity, the row decoder 120 and column decoder 130 may in some cases be below the memory array 102. Each decoder 120, 130 may include or be coupled with one or more drivers configured to drive the access lines 110, 115 to desired voltages (e.g., to access one or more associated memory cells 105). In some cases, the drivers may be distributed throughout an area under the memory array 102. Vias may extend through one or more layers or decks of the memory device 100 to couple the drivers with their corresponding access lines 110, 115. For example, if the access lines 110, 115 are considered to extend in horizontal directions (e.g., an x direction or a y direction), vias may extend in a vertical (z) direction. In some cases, one or more layers between the drivers and the access lines may include metal routing lines, which may be referred to as interconnect layers or collectively as an interconnect layer, where drivers may be coupled with corresponding lines in the interconnect layer and vias may extend between the interconnect layer and the layers that include the access lines 115.

In some cases, the access lines at different levels of the memory array 102 may have different resistivities. For example, word lines 110 at the bottom of the memory array 102 (associated with the lower deck) may have a different (e.g., higher) resistivity than word lines 110 at the top the memory array 102 (associated with the upper deck). As another example, word lines 110 at the bottom of the memory array 102 (associated with the lower deck) may have a different (e.g., higher) resistivity than the illustrated bit lines 115. Additionally or alternatively, word lines 110 at the top of the memory array 102 (associated with the upper deck) may have a different (e.g., lower) resistivity than the illustrated bit lines 115. The different resistivities of the access lines at the different levels may relate to the access lines at the different levels being oxidized to different extends, as described herein. Access lines with higher resistivities may be oxidized to a greater extent that access lines with lower resistivities.

Figure 2:
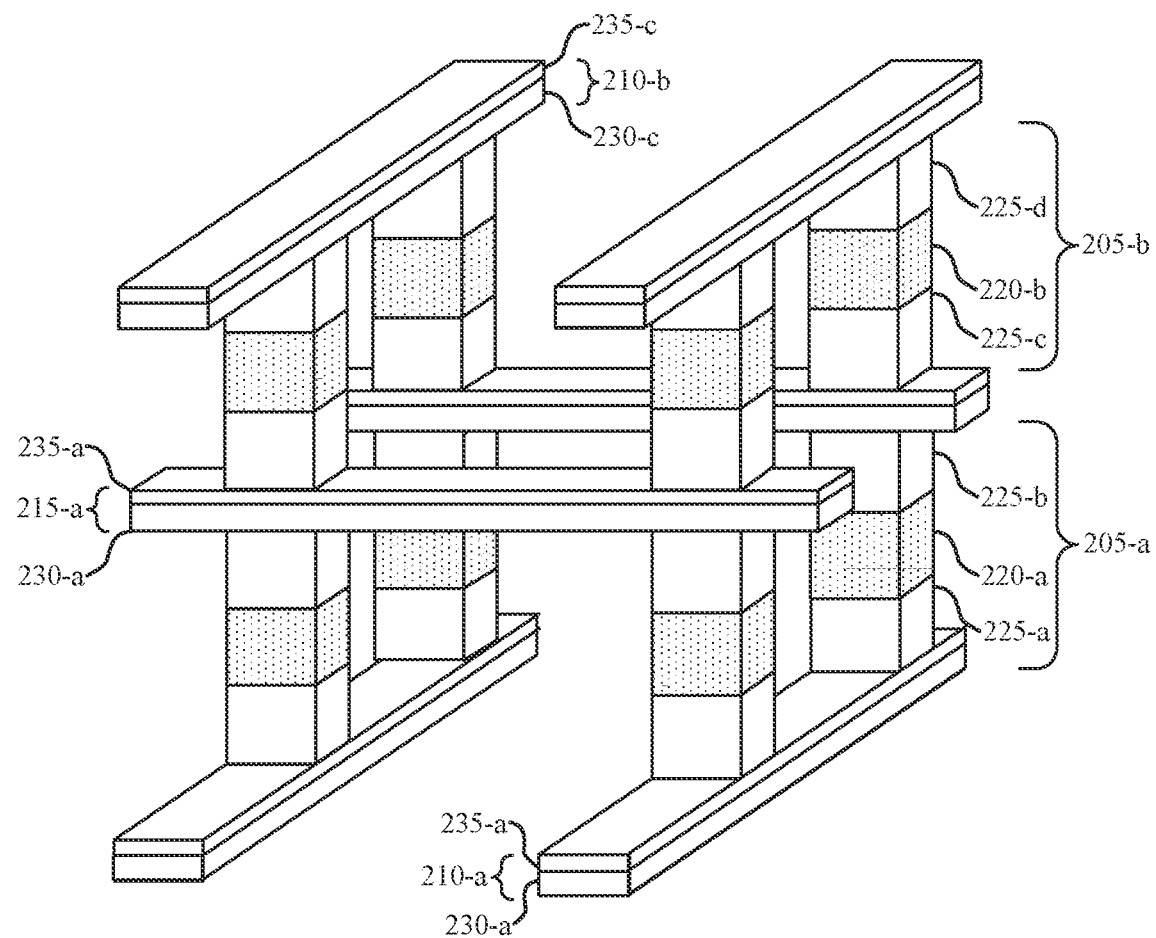
FIG. 2 illustrates an example of a memory array that supports configurable resistivity for lines in the memory array in accordance with examples as disclosed herein.
Figure 2:
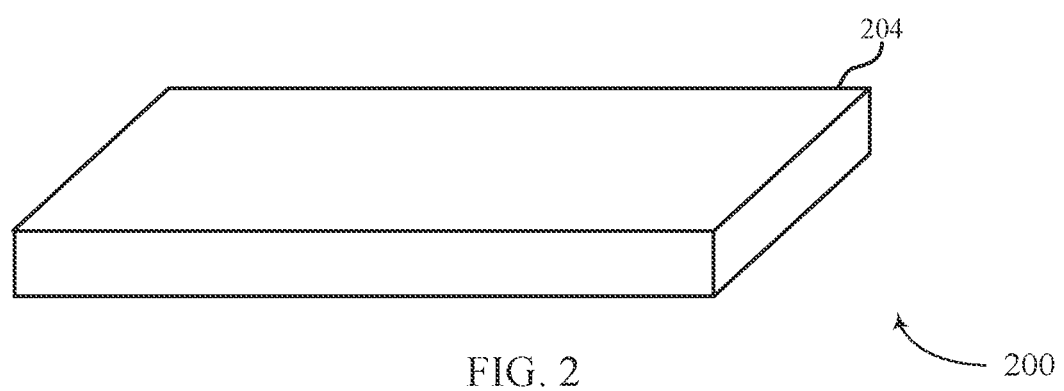

FIG. 2 illustrates an example of a 3D memory array 200 that supports configurable resistivities for lines in the memory array 200 with examples as disclosed herein. The memory array 200 may be an example of portions of a memory array 102 described with reference to FIG. 1. The memory array 200 may include a first array or deck 205-a of memory cells that is positioned above a substrate 204 and second array or deck 205-b of memory cells that is positioned above the first array or deck 205-a. Though the example of the memory array 200 includes two decks 205-*a*, 205-*b*, it is to be understood that one deck 205 (e.g., a 2D memory array) or more than two decks 205 are also possible. Further, although some elements included in FIG. 2 are labeled with a numeric indicator, other corresponding elements are not labeled though they are the same or would be understood to be similar, in an effort to increase visibility and clarity of the depicted features.

The memory array 200 may also include word lines 210 and bit lines 215, which may be examples of word lines 110 and bit lines 115 as described with reference to FIG. 1. The word lines 210 and bit lines 215 may have been initially formed (fabricated) from corresponding metal layers, and thus may initially comprise a metal material such as tungsten (W), copper (Cu), aluminum (Al), gold (Au), titanium (Ti), or a metal alloy.

After being formed (e.g., patterned), the word lines 210 and bit lines 215 may have been oxidized, as described in more detail elsewhere herein, to configure the word lines 210 and bit lines 215 at a given level of the memory array 200 to have a desired resistivity. In some cases, the resistivity of an access line may be expressed as an amount of electrical resistance per unit of length of the access line (e.g., resistivity may in some cases be expressed in units of ohm meters-ohms per meter length multiplied by the cross-sectional area of the access line as expressed in square meters-resulting in a fixed amount of electrical resistance per unit of length of the access line if the cross-sectional area of the access line is constant). Additionally or alternatively, the resistivity of an access line or may be expressed as a sheet resistance, which may be a measure of resistivity of materials comprising or formed from sheets of material having a uniform thickness. In some cases, a sheet resistance may be expressed in units of ohms square, which may be dimensionally equal to an ohm (e.g., as a result of dividing the resistivity unit of ohm meter by the uniform sheet thickness as expressed in meters) but may specifically connote sheet resistance (e.g., rather than bulk resistance, such as of a conventional resistor).

Memory cells of the first deck 205-*a* may include first electrode 225-*a*, a memory element 220-*a*, and a second electrode 225-*b*. In addition, memory cells of the second deck 205-*b* may include a first electrode 225-*c*, a memory element 220-*b*, and a second electrode 225-*d*. The memory cells of the first deck 205-*a* and second deck 205-*b* may, in some examples, have common conductive lines such that corresponding memory cells of each deck 205-*a* and 205-*b* may share bit lines 215 or word lines 210 as described with reference to FIG. 1. For example, first electrode 225-*c* of the second deck 205-*b* and the second electrode 225-*b* of the first deck 205-*a* may be coupled to bit line 215-*a* such that bit line 215-*a* is shared by vertically adjacent memory cells.

The architecture of memory array 200 may in some cases be referred to as a cross-point architecture, in which a memory cell is formed at a topological cross-point between a word line 210 and a bit line 215 as illustrated in FIG. 2. Such a cross-point architecture may offer relatively high-density data storage with lower production costs compared to at least some other memory architectures. For example, the cross-point architecture may have memory cells with a reduced area and, resultantly, an increased memory cell density compared to at least some other architectures.

Though one memory element 220 per memory cell is shown for the sake of clarity, memory cells of the first deck 205-*a* and the second deck 205-*b* may each include one or more memory elements 220 (e.g., elements comprising a memory material configurable to store information), which may or may not be self-selecting memory elements. In some examples, a memory element 220 may, for example, comprise a chalcogenide material or other alloy including selenium (Sc), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some other examples, a SAG-alloy may also contain indium (In), and such chalcogenide material may in some cases be referred to as InSAG-alloy. In some examples, a chalcogenide may include additional elements such as hydrogen (H), oxygen (O), nitrogen (N), chlorine (Cl), or fluorine (F), each in atomic or molecular forms.

In some cases, a memory element 220 may be included in a PCM cell. Within a PCM cell, a memory element 220 may be switched from amorphous to crystalline and vice versa, and thus a state may be written to the memory cell that includes the memory element 220 by applying a voltage across and thus passing current through the memory element 220 so as to heat the memory element 220 beyond a melting temperature, and then removing the voltage and current according to various timing parameters configured to render the memory element 220 in the desired state (e.g., amorphous or crystalline). Heating and quenching of the memory element 220 may be accomplished by controlling current flow through the memory element 220, which in turn may be accomplished by controlling the voltage differential between the corresponding word line 210 and corresponding bit line 215.

A memory element 220 in the crystalline state may have atoms arranged in a periodic structure, which may result in a relatively low electrical resistance (e.g., set state). By contrast, a memory element 220 in an amorphous state may have no or relatively little periodic atomic structure, which may have a relatively high electrical resistance (e.g., reset state). The difference in resistance values between amorphous and crystalline states of the memory element 220 may be significant; for example, a material in an amorphous state may have a resistance one or more orders of magnitude greater than the resistance of the material in its crystalline state. In some cases, the amorphous state may have a threshold voltage associated with it and current may not flow until Vth is exceeded. Some PCM cells may include one memory element 220 configured to undergo phase changes and thereby act as a storage element and another memory element 220 configured to act as a diode (e.g., a snapback diode) and thus as a selection element. The selection element may be configured to remain in an amorphous state even when the storage element in the same PCM cell is placed into a crystalline state.

In some cases, a memory element 220 may be partially amorphous and partially crystalline, and the resistance may be of some value between the resistances of the memory element 220 in a wholly crystalline or wholly amorphous state. A memory element 220 thus may be used for other than binary logic applications—i.e., the number of possible states stored in a material may be more than two.

In some cases, a memory element 220 included in a self-selecting memory cell may be operated so as to not undergo a phase change during normal operation of the memory cell (e.g., due to the composition of the memory (e.g., chalcogenide) material, and/or due to operational voltages and currents configured to maintain the memory element 220 in a single phase, such as an amorphous or glass phase). For example, the memory element 220 may include a chemical element, such as arsenic, that inhibits crystallization of a chalcogenide material and thus may remain in an amorphous state. Here, some or all of the set of logic states supported by the memory cells (e.g., including memory element 220 and electrodes 225) may be associated with an amorphous state of the memory element 220 (e.g., stored by the memory element 220 while the memory element 220 is in the amorphous state). For example, a logic state '0' and a logic state '1' may both be associated with an amorphous state of the memory element 220 (e.g., stored by the memory element 220 while the memory element 220 is in the amorphous state). In some cases, memory element 220 may be configured to store a logic state corresponding to an information bit.

During a programming (write) operation of a memory cell (e.g., including electrodes 225-a, memory element 220-a, and electrode 225-b), the polarity used for programming (writing) or whether the memory element 220 is programmed into an amorphous or crystalline state may influence (determine, set, program) a particular behavior or characteristic of the memory element 220, such as the threshold voltage or resistance of the memory element 220. The difference in threshold voltages or resistances of the memory element 220 depending on the logic state stored by the memory element 220 (e.g., the difference between the threshold voltage or resistance when the memory element 220 is storing a logic state '0' versus a logic state '1') may correspond to the read window of the memory element 220.

The word line 210-a may be at a first level of the memory array 200, the bit line 215-a may be at a second level of the memory array 200, and the word line 210-c may be at a third level of the memory array 200. Each word line 210 and bit line 215 may include a respective metal portion 230 and metal oxide portion 235. As discussed above and elsewhere herein, a word line 210 or bit line 215 may have been initially formed (fabricated) from a corresponding metal layer, and the respective metal portion 230 may comprise the same metal material. As also discussed above and elsewhere herein, the word line 210 or bit line 215 may have been subsequently oxidized to form the respective metal oxide portion 235. The metal oxide portion 235 may comprise the oxide of the metal included in the metal portion 230 (e.g., if the metal portion 230 comprises tungsten (W), then the metal oxide portion 235 may comprise tungsten oxide ($W_xO_y$); if the metal portion 230 comprises aluminum (Al), then the metal oxide portion 235 may comprise aluminum oxide ($Al_xO_y$); and so on).

For a word line 210 or bit line 215, the resistivity of the access line may depend on the thickness (cross-sectional area) of the respective metal portion 230 and the thickness of the respective metal oxide portion 235. For example, the metal portion 230 may have a lower resistivity than the metal oxide portion, and thus a thicker metal portion 230 may have a lower resistivity (be more conductive), while a thinner metal portion 230 may have a higher resistivity (be less conductive). If the overall cross-sectional area of an access line is fixed (e.g., constant within or across levels of the memory array 200), then a thicker metal oxide portion 235 may correspond to a thinner metal portion 230 and thus a higher resistivity, while a thinner metal oxide portion 235 may correspond to a thicker metal portion 230 and thus a lower resistivity. Thus, for a same overall cross-sectional area, an access line that is oxidized to a greater extent may have a higher resistivity than an access line that is oxidized to a lesser extent.

Accordingly, tuning (configuring) of the resistivities of the access lines (e.g., word lines 210 or bit lines 215) at different levels of the memory array 200 may be achieved through selectively oxidizing the access lines to different extents, so as to form respective metal portions 230 and metal oxide portions 235 of desired thicknesses. For example, metal portion 230-c may be thicker than metal portion 230-a (e.g., due to metal oxide portion 235-c being thinner than metal oxide portion 235-a, and word lines 210-c and 210-a being initially formed from the same material and to have the same overall cross-sectional area). Thus, access lines at different decks 205 of the memory array 200 may have different resistivities. Additionally or alternatively, in some cases, access lines within the same deck 205 of the memory array 200 but at different levels may have different resistivities. For example, metal portion 230-b may be thicker than metal portion 230-a (e.g., due to metal oxide portion 235-b being thinner than metal oxide portion 235-a, and bit line 215-a and word line 210-a being initially formed from the same material and to have the same overall cross-sectional area).

Oxidation of access lines may be achieved by a variety of oxidation processes including wet and dry processing techniques. For example, oxidation of access lines may be achieved by wet processing techniques where the access lines are exposed to liquid hydrogen peroxide (or another liquid oxidizing agent). Additionally or alternatively, oxidation of the access lines may be achieved by dry processing techniques where the access lines are exposed to oxygen (e.g., in a gas or plasma form). The wet and/or dry processing techniques may be modulated (controlled, tuned) so as to configure the thicknesses of the oxide portions 235 such that desired resistivities of the access lines are achieved. In some cases, access lines at different levels of the memory array 200 may be performed sequentially (e.g., access lines at a higher level may be formed after access lines at a lower have already been formed). Access lines at a given level of the memory array 200 may be oxidized after being formed and before the formation of access lines at another (e.g., higher) level.

Though the example of FIG. 2 illustrates the metal portions 230 and metal oxide portions 235 as distinct sublayers, with the sublayer corresponding to a metal oxide portion 235 above the sublayer corresponding to the respective metal portion 230, one of ordinary skill in the art would appreciate that a metal portion 230 and a metal oxide portion 235 of a same access line may be otherwise distributed, depending on the fabrication techniques and stage of fabrication at which the access line is oxidized. For example, oxidizing an access line while an upper surface of the access line is exposed to the oxidation agent (e.g., liquid hydrogen peroxide, oxygen in gas or plasma form) may result in metal oxide portions 235 formed as sublayers above metal portions 230, but metal oxide portions 235 may additionally or alternatively be formed on the sidewalls of metal portions 230.

Further, one or ordinary skill in the art will appreciate that some access lines (e.g., at one level) may not be oxidized, so as to obtain a low resistivity for such access lines, while access lines at one or more other levels may be oxidized to one or more different extents, so as to obtain one or more higher resistivities for such access lines. Also, concepts described herein in terms of resistivity may alternatively be expressed in terms of conductivity, which may be the inverse of resistivity.

Figure 3:
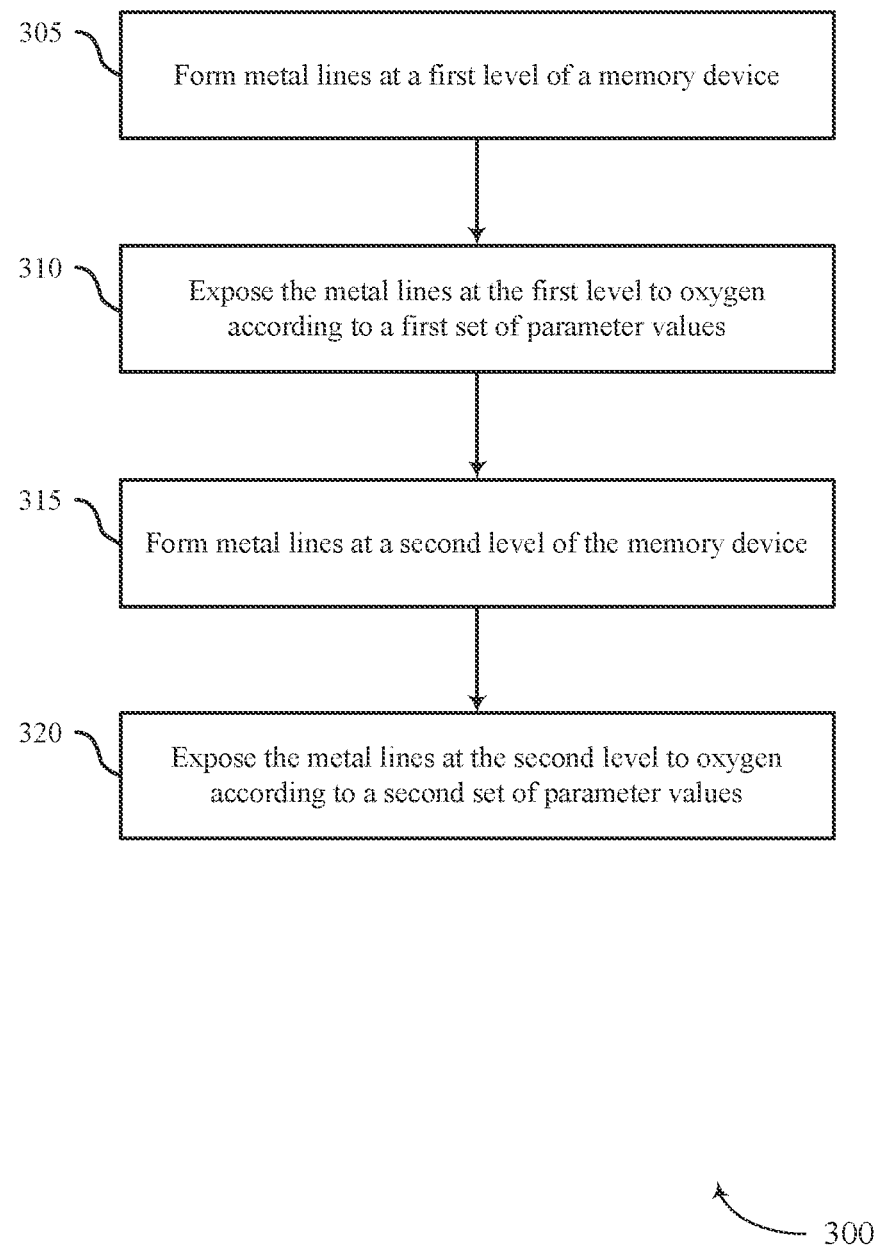
FIG. 3 illustrates a flow diagram of an example method for configuring resistivity for lines in a memory array in accordance with examples as disclosed herein.

FIG. 3 illustrates a flow diagram of an example method 300 for configuring resistivity for metal lines in a memory device in accordance with examples as disclosed herein. In some cases, for example, the method 400 may be used to configure the resistivities of access lines such as those of a memory array 102 as described with reference to FIG. 1 or a memory array 200 as described with reference to FIG. 2. Although shown in a particular sequence or order, unless otherwise specified, the order of the processes may be modified. Thus, the illustrated embodiments should be understood only as examples, and the illustrated processes may be performed in a different order, and some processes may be performed in parallel. Additionally, one or more processes may be omitted in various embodiments. Thus, not all processes are required in every embodiment. Other process flows are possible.

At 305, metal lines may be formed at a first level of a memory device. For example, the metal lines may be access lines (e.g., word lines or bit lines) within a memory array. The metal lines may be formed using any number of masking (e.g., patterning), removal (e.g., etching), or formation (e.g., deposition) techniques. For example, a metal layer (material) may be formed above a substrate (e.g., above an intervening stack of materials also formed above the substrate), and the metal layer may be patterned to form any number of metal lines.

At 310, the metal lines at the first level may be exposed to oxygen according to a first set of parameter values. Exposing the metal lines to oxygen may oxidize the metal that the metal lines are made of and thereby increase the resistivity (e.g., lower the effective thickness) of the metal lines. The first set of parameters may be selected (tuned) to configure the extent to which the metal lines at the first level are oxidized and thus the resistivity of the metal lines at the first level. The overall cross-sectional area of the metal lines at the first level may remain the same after 310 as after 305, but the effective thickness of the metal within the metal lines at the first level may decrease in proportion to the extent of oxidation. Therefore, tuning the resistivity of the metal lines at the first level may be accomplished independently of how the metal lines are initially formed at 305.

The metal lines formed at 305 may be exposed to oxygen in a variety of ways. For example, the metal lines formed at 305 may be exposed to oxygen in a gas and/or plasma form, which may be referred to as a dry process or technique, and which may oxidize the metal lines (e.g., tungsten lines) to form metal oxide (e.g., tungsten oxide).

In some cases. 310 may include using a diffusion process. For example, the metal lines may be exposed to oxygen plasma in a plasma chamber used for diffusion. Examples of diffusion processes may be chemical vapor deposition (CVD) processes, atomic layer deposition (ALD) processes, plasma-enhanced chemical vapor deposition (PCDEV) processes, or other processes where oxygen plasma may be used. In such processes, metal may be selectively converted from more-conductive metal to less-conductive metal oxide to a desired extent (e.g., a desired thickness of a metal oxide portion 235) based on a variety of parameters that may be adjusted for the diffusion process. As one example parameter, the pressure of the plasma chamber may be varied to target the desired oxidation extent. In this case, the higher the pressure of the plasma chamber, the greater the degree (extent) of oxidation may be due to the increased amount of oxygen available within the chamber to oxidize the metal. As another example parameter, the exposure time (e.g., duration for which the metal is exposed to the oxygen plasma) may be varied to target the desired oxidation extent. In this case, the more time that the metal is exposed to the oxygen, the greater the extent of oxidation may be. As yet another example parameter, the excitation power of the oxygen plasma may be varied to target the desired extent of oxidation. In this case, the greater the excitation power of the plasma, the greater the extent of oxidation of the metal. In some examples, other parameters of the diffusion process may be adjusted. And as yet another example parameter, the concentration of oxygen within the oxygen plasma may be varied to target the desired extent of oxidation. In this case, the greater the concentration of oxygen, the greater the extent of oxidation of the metal. In some examples, other parameters of the diffusion process may be adjusted. These or any number of other parameters associated with the diffusion process may be set (adjusted, configured) independently, or in combination, to tune the extent of oxidation and thus the resistivity of the metal lines formed at 305.

In some cases, 310 may include using a dry etch process. In a dry etch process, the metal lines may be exposed to oxygen that has been ignited in a dry etch chamber. While the metal lines are exposed to the oxygen, a voltage may be applied to bias an electrostatic chuck in the dry etch chamber. For example, the metal lines may be in electronic communication with the electrostatic chuck through the substrate above which the metal lines are formed or otherwise, and the bias voltage applied to the electrostatic chuck may be selectively tuned (configured) so as to impact the extent of oxidation of the metal lines (e.g., by tuning the difference in voltage potential between the metal lines the ion deposition tool). Thus, as one example parameter, the voltage differential may be varied to target the desired extent of oxidation (e.g., by varying the bias voltage of the chuck, of the ion deposition tool, or both). In this case, the greater the voltage differential, the greater the extent of oxidation may be.

The dry etch process may also support any number of other configurable parameters that may be used to control the extent of oxidation at 310. For example, similar to the diffusion process, the dry etch chamber prssurv, exposure time, and excitation power may be adjusted. In some cases, additional parameters may be adjusted in the dry etch process to further increase the selectivity (degree of control) of the extent of oxidation. As one example parameter, the oxygen ratio of the plasma may be adjusted to target the desired of extent of oxidation. In this case, the higher the oxygen content of the plasma, the greater the extent of oxidation may be. As another example parameter, the radio frequency (RF) power of the magnetic field in the dry etch chamber may be adjusted. In this case, the higher the RF power, the greater the extent of oxidation may be. As yet another example parameter, the inner to outer coil ratio for the dry etch chamber may be adjusted to modify the source power distribution in the chamber. In this case, adjusting the inner to outer coil ratio for the dry etch chamber may impact the uniformity of oxidation across different aspects of a wafer or other structure (e.g., a higher inner to outer coil ratio may cause a greater extent of oxidation near the center of the wafer or other structure relative to the extent of oxidation farther away from the center of the wafer or other structure, while a lower inner to outer coil ratio may cause a lesser extent of oxidation near the center of the wafer or other structure relative to the extent of oxidation farther away from the center of the wafer or other structure). Thus, for example, the extent of oxidation (and thus the resistivity) of an access line at a given level of a memory device may in some cases vary along the length of the access line (e.g., with portions formed farther from the center of an associated wafer less oxidized and thus less resistive). And as yet another example parameter, the temperature of the chuck, of the metal lines or the associated wafer, or of another aspect of the dry etch chamber or process may be adjusted. In this case, the higher the temperature, the greater the extent of oxidation may be. These or any number of other parameters associated with the diffusion process may be set (adjusted, configured) independently, or in combination, to tune the extent of oxidation and thus the resistivity of the metal lines formed at 305.

At 315, metal lines may be formed at a second level of the memory device. For example, the metal lines may be access lines (e.g., word lines or bit lines) within the memory array. The metal lines may be formed at the second level using any number of masking (e.g., patterning), removal (e.g., etching), or formation (e.g., deposition) techniques. For example, a metal layer (material) may be formed at the second level, which may be above the first level (e.g., above an intervening stack of one or more materials or structures also formed above the first level), and the metal layer at the second level may be patterned to form any number of metal lines at the second level. In some cases, the metal lines formed at 315 may be formed using a same or similar process as that used to form the metal lines at 305 but applied at a different level of the memory device. Thus, in some cases, the metal lines formed at 315 may be identical or at least substantially identical in material and cross-sectional area to the metal lines formed at 305.

In some cases, the set of metal lines formed at 305 and the set of metal lines formed at 310 may be a same type of metal lines (e.g., both sets may be word lines, or both sets may be bit lines). In other cases, the set of metal lines formed at 305 and the set of metal lines formed at 310 may be different types of metal lines (e.g., one set may be word lines, and another set may be bit lines. Further, any number of additional materials or structures may be formed below the metal lines at the first level, above the metal lines at the second level, or between the first level and the second level. For example, the first level and the second level may both be included in a same deck 205 of memory cells or may be included in different decks 205 of memory cells.

At 320, the metal lines at the second level may be exposed to oxygen according to a second set of parameter values. Any of the techniques described with reference to 310 may be used, either alone or in any combination, at 320 to oxidize the metal lines at the second level to a desired extent. For example, any number of the various parameters described with reference to 320 may be adjusted (e.g., may differ between the second set of parameters at 320 and the first set of parameters at 310), alone or in any combination, so as to target a different extent of oxidation and thus a different resistivity for the metal lines at the second level as compared to the metal lines at the first level. Thus, for example, any parameter described with reference to 310 may have a first value (setting) at 310 and a second value or at 320.

One or more operations associated with 310 may be performed while the access lines formed at 305 are at least partially exposed (e.g., at least one surface of each of the access lines formed at 305 is exposed at a surface of a wafer), and one or more operations associated with 320 may be performed while the access lines formed at 315 are at least partially exposed (e.g., at least one surface of each of the access lines formed at 315 is exposed at a surface of a wafer). In some cases, a first cleaning operation may be performed between 305 and 310, and a second cleaning operation may be performed between 315 and 320.

Figure 4:
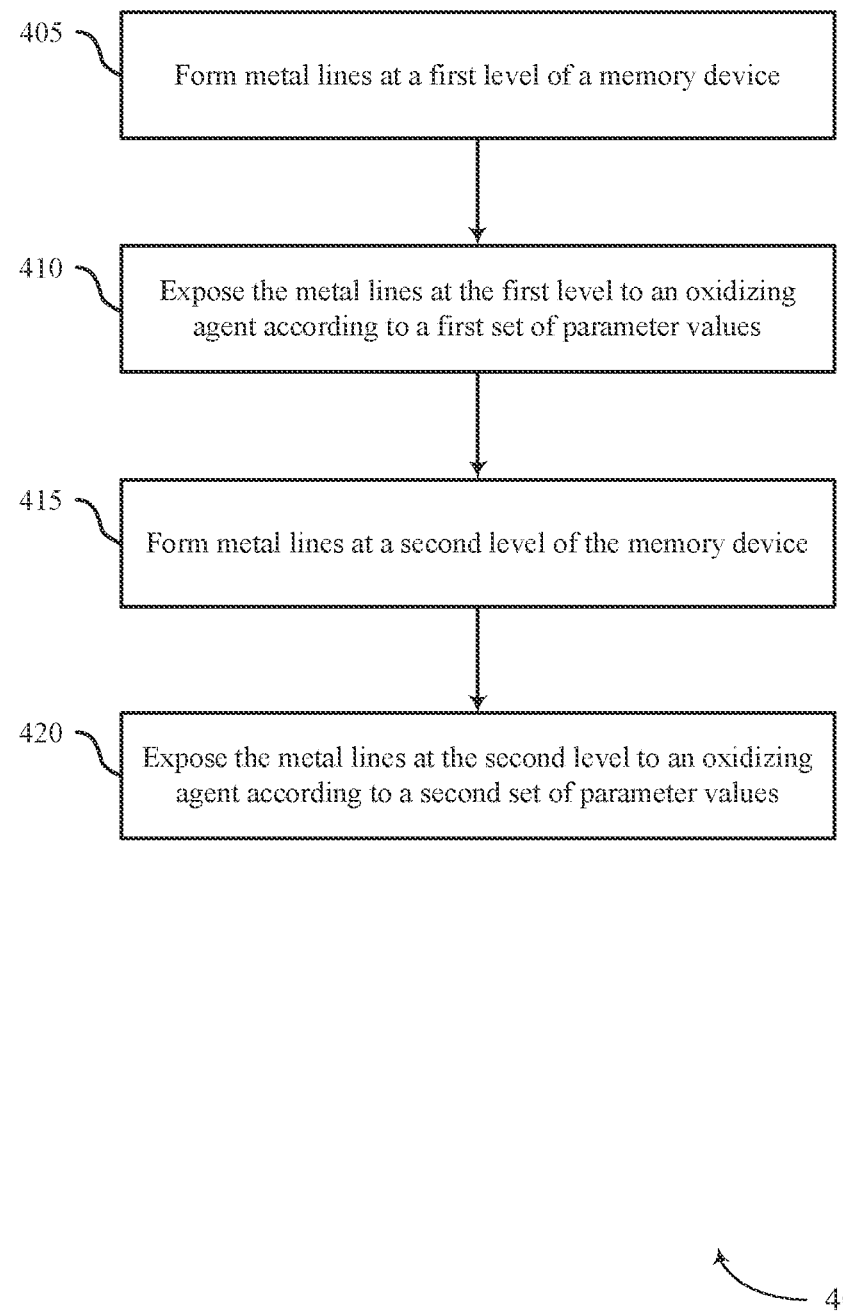
FIG. 4 illustrates a flow diagram of an example method for configuring resistivity for lines in a memory array in accordance with examples as disclosed herein.

FIG. 4 illustrates a flow diagram of an example method 400 for configuring resistivity for lines in a memory device in accordance with examples as disclosed herein. In some cases, for example, the method 400 may be used to configure the resistivities of access lines such as those of a memory array 102 as described with reference to FIG. 1 or a memory array 200 as described with reference to FIG. 2. Although shown in a particular sequence or order, unless otherwise specified, the order of the processes may be modified. Thus, the illustrated embodiments should be understood only as examples, and the illustrated processes may be performed in a different order, and some processes may be performed in parallel. Additionally, one or more processes may be omitted in various embodiments. Thus, not all processes are required in every embodiment. Other process flows are possible.

At 405, metal lines may be formed at a first level of a memory device. For example, the metal lines may be access lines (e.g., word lines or bit lines) within a memory array. The metal lines may be formed using any number of masking (e.g., patterning), removal (e.g., etching), or formation (e.g., deposition) techniques. For example, a metal layer (material) may be formed above a substrate (e.g., above an intervening stack of materials also formed above the substrate), and the metal layer may be patterned to form any number of metal lines.

At 410, the metal lines at the first level may be exposed to an oxidizing agent (e.g. solution) according to a first set of parameter values. In some cases, the oxidizing agent may be or include peroxide. For example, the oxidizing agent may be hydrogen peroxide or a solution that includes hydrogen peroxide. In some cases, the oxidizing agent may be included in a solution that may also serve as a cleaning solution. For example, a solution that includes ammonium, ammonium hydroxide, and hydrogen peroxide—possibly in addition to deionized water—may be used as an oxidizing agent and, additionally or alternatively, as a cleaning solution. Such a solution may in some cases be referred to as an APM or standard clean 1 (SC1) solution.

Exposing the metal lines to the oxidizing agent at 410 may oxidize the metal that the metal lines are made of and thereby increase the resistivity (e.g., lower the effective thickness) of the metal lines. The first set of parameters may be selected (tuned) to configure the extent to which the metal lines at the first level are oxidized and thus the resistivity of the metal lines formed at 405. The overall cross-sectional area of the metal lines at the first level may remain the same after 410 as after 405, but the effective thickness of the metal within the metal lines at the first level may decrease in proportion to the extent of oxidation. Therefore, tuning the resistivity of the metal lines at the first level may be accomplished independently of how the metal lines are initially formed at 405.

The metal lines formed at 305 may be exposed to the oxidizing agent in a variety of ways. For example, the metal lines formed at 305 may be exposed to the oxidizing agent using a liquid solution or oxidizing agent, which may be referred to as a wet process. In some cases, after the metal lines are formed at 405, a cleaning process may occur to prepare the structure that includes the metal lines for subsequent processing. The cleaning process may include exposing the metal lines formed at 405 to a cleaning solution. The cleaning solution may include ammonium hydroxide, for example. In some cases, the oxidizing agent may be added to the cleaning solution (e.g., hydrogen peroxide may be added to the cleaning solution), such that both cleaning and oxidation occur concurrently at 410. In other cases, the metal lines formed at 405 may be exposed to the oxidizing agent after a cleaning process (e.g., the metal lines formed at 405 may be cleaned using a cleaning solution that does not include an oxidizing agent), such that the cleaning occurs in between 405 and 410. Even where a distinct cleaning step using a cleaning solution that lacks an oxidizing agent is used between 405 and 410, the oxidizing agent used at 410 may nevertheless be included in a solution with cleaning capabilities (e.g., a first cleaning solution that lacks the oxidizing agent may be used as part of a cleaning process between 405 and 410, and then a second, different cleaning solution that includes the oxidizing agent may be used at 410). Further, in some cases, more than one oxidizing agent may be used either concurrently or sequentially (e.g., as part of a single solution or as part of different, sequentially applied solutions).

In a wet process, metal may be selectively converted from more-conductive metal to less-conductive metal oxide to a desired extent (e.g., a desired thickness of a metal oxide portion 235) based on a variety of parameters that may be adjusted for the wet process. As one example parameter, the concentration of the oxidizing agent (e.g., a peroxide, such as hydrogen peroxide) within a solution to which the metal lines are exposed at 410 may be varied to target a desired extent of oxidation. In this case, the higher the concentration of the oxidizing agent, the greater the extent of oxidation may be. As another example parameter, the exposure time (duration for which the metal lines are exposed to the oxidizing agent at 410) may be varied to target the desired extent of oxidation. As yet another example parameter, the oxidizing agent may be selected (and thus varied from level to level) to target the desired extent of oxidation. In this case, the stronger (e.g., more oxidizing at a given concentration and exposure time) the oxidizing agent may be, the greater the extent of oxidation may be. These or any number of other parameters associated with the wet process may be set (adjusted, configured) independently, or in combination, to tune the extent of oxidation and thus the resistivity of the metal lines formed at 405.

At 415, metal lines may be formed at a second level of the memory device. For example, the metal lines may be access lines (e.g., word lines orbit lines) within the memory array. The metal lines may be formed at the second level using any number of masking (e.g., patterning), removal (e.g., etching), or formation (e.g., deposition) techniques. For example, a metal layer (material) may be formed at the second level, which may be above the first level (e.g., above an intervening stack of one or more materials or structures also formed above the first level), and the metal layer at the second level may be patterned to form any number of metal lines at the second level. In some cases, the metal lines formed at 415 may be formed using a same or similar process as that used to form the metal lines at 405 but applied at a different level of the memory device. Thus, in some cases, the metal lines formed at 415 may be identical or at least substantially identical in material and cross-sectional area to the metal lines formed at 405.

In some cases, the set of metal lines formed at 405 and the set of metal lines formed at 410 may be a same type of metal lines (e.g., both sets may be word lines, or both sets may be bit lines). In other cases, the set of metal lines formed at 405 and the set of metal lines formed at 410 may be different types of metal lines (e.g., one set may be word lines, and another set may be bit lines). Further, any number of additional materials or structures may be formed below the metal lines at the first level, above the metal lines at the second level, or between the first level and the second level. For example, the first level and the second level may both be included in a same deck 205 of memory cells or may be included in different decks 205 of memory cells.

At 420, the metal lines at the second level may be exposed to an oxidizing agent according to a second set of parameter values. Any of the techniques described with reference to 410 may be used, either alone or in any combination, at 420 to oxidize the metal lines at the second level to a desired extent. For example, any number of the various parameters described with reference to 420 may be adjusted (e.g., may differ between the second set of parameters at 420 and the first set of parameters at 410), alone or in any combination, so as to target a different extent of oxidation and thus a different resistivity for the metal lines at the second level as compared to the metal lines at the first level. Thus, for example, any parameter described with reference to 410 may have a first value (setting) at 410 and a second value or at 420.

One or more operations associated with 410 may be performed while the access lines formed at 405 are at least partially exposed (e.g., at least one surface of each of the access lines formed at 405 is exposed at a surface of a wafer), and one or more operations associated with 420 may be performed while the access lines formed at 415 are at least partially exposed (e.g., at least one surface of each of the access lines formed at 415 is exposed at a surface of a wafer). Further, the metal lines may be exposed to an oxidizing agent at 420 concurrent with or subsequent to a cleaning process, in similar fashion as described with respect to 410.

Figure 5:
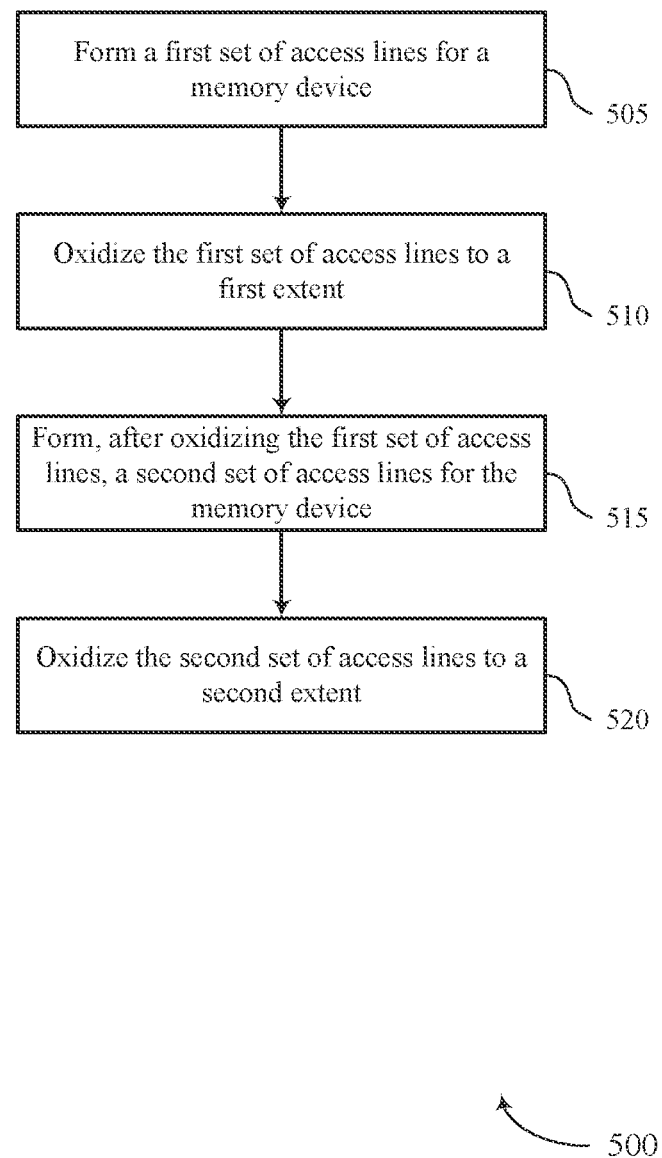
FIG. 5 illustrates a flowchart illustrating a method that supports configuring resistivity for lines in a memory array in accordance with examples as disclosed herein.

FIG. 5 shows a flowchart illustrating a method or methods 500 that supports configurable resistivity for lines in a memory device in accordance with aspects of the present disclosure. The operations of method 500 may be implemented by a formation tool, or a dry processing tool, or a wet processing tool, or their components as described herein.

At 505, a first set of access lines may be formed for a memory device. The operations of 505 may be performed according to the methods described herein. In some examples, aspects of the operations of 505 may be performed by a formation tool.

At 510, the first set of access lines may be oxidized to a first extent. The operations of 510 may be performed according to the methods described herein. In some examples, aspects of the operations of 510 may be performed by a wet processing tool or a dry processing tool.

At 515, after the first set of access lines are oxidized, a second set of access lines may be formed for the memory device. The operations of 515 may be performed according to the methods described herein. In some examples, aspects of the operations of 515 may be performed by a formation tool.

At 520, the second set of access lines may be oxidized to a second extent. The operations of 520 may be performed according to the methods described herein. In some examples, aspects of the operations of 520 may be performed by a wet processing tool or a dry processing tool.

In some examples, an apparatus as described herein may perform a method or methods, such as the method 500. The apparatus may include features or means for forming a first set of access lines for a memory device, oxidizing the first set of access lines to a first extent, forming, after oxidizing the first set of access lines, a second set of access lines for the memory device, and oxidizing the second set of access lines to a second extent.

In some examples of the method 500 and the apparatus described herein, the second set of access lines may be above the first set of access lines.

In some examples of the method 500 and the apparatus described herein, the second extent may be less than the first extent.

Some examples of the method 500 and the apparatus described herein may further include operations, features, or means for forming a first deck of memory cells coupled with the first set of access lines, and forming a second deck of memory cells coupled with the second set of access lines.

In some examples of the method 500 and the apparatus described herein, operations, features, or means for oxidizing the first set of access lines may include operations, features, or means for exposing the first set of access lines to plasma that includes oxygen, and operations, features, or means for oxidizing the second set of access lines may include operations, features, or means for exposing the second set of access lines to plasma that includes oxygen.

In some examples of the method 500 and the apparatus described herein, the first set of access lines may be exposed to plasma that includes oxygen as part of a first dry etch process, and the second set of access lines may be exposed to plasma that includes oxygen as part of a second dry etch process.

In some examples, the first set of access lines and the second set of access lines may be formed on a wafer. Some examples of the method 500 and the apparatus described herein may further include operations, features, or means for applying a first voltage to the wafer while the first set of access lines may be exposed to plasma that includes oxygen, where the first extent may be based on the first voltage, and applying a second voltage to the wafer while the second set of access lines may be exposed to plasma that includes oxygen, where the second extent may be based on the second voltage.

In some examples of the method 500 and the apparatus described herein, the first set of access lines may be exposed to plasma that includes oxygen for a first amount of time, the first extent based on the first amount of time, and the second set of access lines may be exposed to plasma that includes oxygen for a second amount of time, the second extent based on the second amount of time.

In some examples, the first set of access lines and the second set of access lines may be formed on a wafer. Some examples of the method 500 and the apparatus described herein may further include operations, features, or means for heating the wafer to a first temperature while the first set of access lines may be exposed to plasma that includes oxygen, where the first extent may be based on the first temperature, and heating the wafer to a second temperature while the second set of access lines may be exposed to plasma that includes oxygen, where the second extent may be based on the second temperature.

Some examples of the method 500 and the apparatus described herein may further include operations, features, or means for exciting the plasma to which the first set of access lines may be exposed using a first amount of power, where the first extent may be based on the first amount of power, and exciting the plasma to which the second set of access lines may be exposed using a second amount of power, where the second extent may be based on the second amount of power.

In some examples of the method 500 and the apparatus described herein, the first set of access lines may be exposed to plasma that includes oxygen under a first amount of pressure, the first extent based on the first amount of pressure, and the second set of access lines may be exposed to plasma that includes oxygen under a second amount of pressure, the second extent based on the second amount of pressure.

In some examples of the method 500 and the apparatus described herein, the first set of access lines may be exposed to plasma that includes oxygen in a first concentration, the first extent based on the first concentration, and the second set of access lines may be exposed to plasma that includes oxygen in a second concentration, the second extent based on the second concentration.

In some examples of the method 500 and the apparatus described herein, operations, features, or means for oxidizing the first set of access lines may include operations, features, or means for exposing the first set of access lines to hydrogen peroxide, and operations, features, or means for oxidizing the second set of access lines may include operations, features, or means for exposing the second set of access lines to hydrogen peroxide.

Some examples of the method 500 and the apparatus described herein may further include operations, features, or means for exposing the first set of access lines to ammonium hydroxide while the first set of access lines may be exposed to hydrogen peroxide, and exposing the second set of access lines to ammonium hydroxide while the second set of access lines set of access lines may be exposed to hydrogen peroxide.

Some examples of the method 500 and the apparatus described herein may further include operations, features, or means for exposing the first set of access lines to ammonium hydroxide before the first set of access lines may be exposed to hydrogen peroxide, and exposing the second set of access lines to ammonium hydroxide before the second set of access lines set of access lines may be exposed to hydrogen peroxide.

In some examples of the method 500 and the apparatus described herein, the first set of access lines may be exposed to hydrogen peroxide for a first amount of time, the first extent based on the first amount of time, and the second set of access lines may be exposed to hydrogen peroxide for a second amount of time, the second extent based on the second amount of time.

In some examples of the method 500 and the apparatus described herein, operations, features, or means for exposing the first set of access lines to hydrogen peroxide may include operations, features, or means for exposing the first set of access lines to a first solution that includes hydrogen peroxide in a first concentration, and operations, features, or means for exposing the second set of access lines to hydrogen peroxide may include operations, features, or means for exposing the second set of access lines to a second solution that includes hydrogen peroxide in a second concentration.

Figure 6:
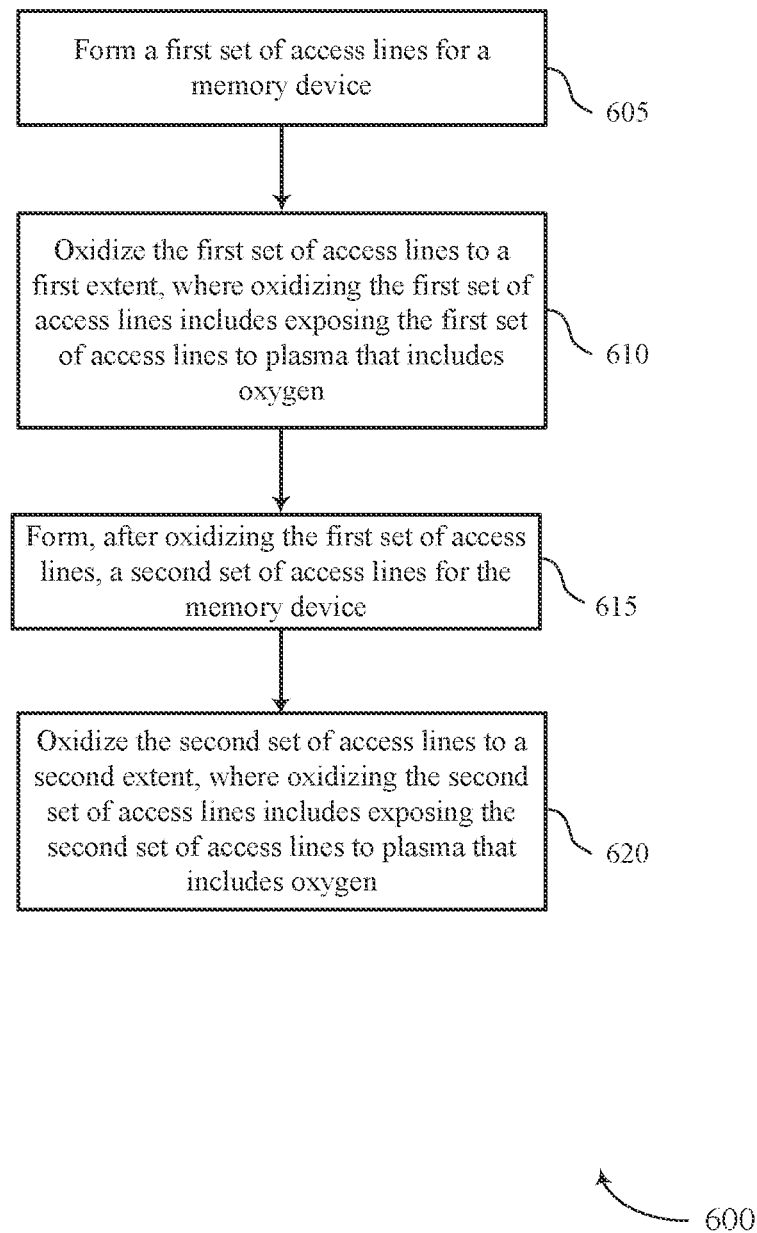
FIG. 6 illustrates a flowchart illustrating a method that supports configuring resistivity for lines in a memory array in accordance with examples as disclosed herein.

FIG. 6 shows a flowchart illustrating a method or methods 600 that supports configurable resistivity for lines in a memory device in accordance with aspects of the present disclosure. The operations of method 600 may be implemented by a formation tool or a dry processing tool, or their components as described herein.

At 605, a first set of access lines may be formed for a memory device. The operations of 605 may be performed according to the methods described herein. In some examples, aspects of the operations of 605 may be performed by a formation tool.

At 610, the first set of access lines may be oxidized to a first extent, which may include exposing the first set of access lines to plasma that includes oxygen. The operations of 610 may be performed according to the methods described herein. In some examples, aspects of the operations of 610 may be performed by a dry processing tool.

At 615, after the first set of access lines are oxidized, a second set of access lines may be formed for the memory device. The operations of 615 may be performed according to the methods described herein. In some examples, aspects of the operations of 615 may be performed by a formation tool.

At 620, the second set of access lines may be oxidized to a second extent, which may include exposing the second set of access lines to plasma that includes oxygen. The operations of 620 may be performed according to the methods described herein. In some examples, aspects of the operations of 620 may be performed by a dry processing tool.

Figure 7:
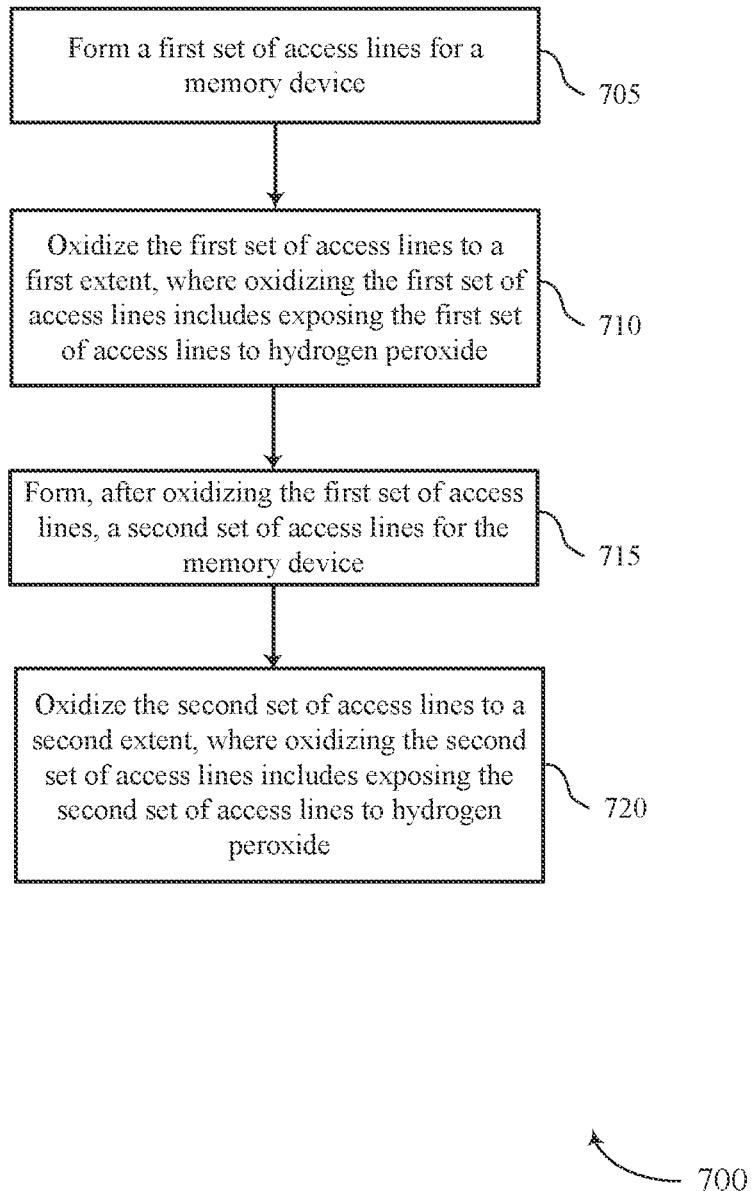
FIG. 7 illustrates a flowchart illustrating a method that supports configuring resistivity for lines in a memory array in accordance with examples as disclosed herein.

FIG. 7 shows a flowchart illustrating a method or methods 700 that supports configurable resistivity for lines in a memory device in accordance with aspects of the present disclosure. The operations of method 700 may be implemented by a formation tool or a wet processing tool, or their components as described herein.

At 705, a first set of access lines may be formed for a memory device. The operations of 705 may be performed according to the methods described herein. In some examples, aspects of the operations of 705 may be performed by a formation tool.

At 710, the first set of access lines may be oxidized to a first extent, which may include exposing the first set of access lines to hydrogen peroxide. The operations of 710 may be performed according to the methods described herein. In some examples, aspects of the operations of 710 may be performed by a wet processing tool.

At 715, after the first set of access lines are oxidized, a second set of access lines may be formed for the memory device. The operations of 715 may be performed according to the methods described herein. In some examples, aspects of the operations of 715 may be performed by a formation tool.

At 720, the second set of access lines may be oxidized to a second extent, which may include exposing the second set of access lines to hydrogen peroxide. The operations of 720 may be performed according to the methods described herein. In some examples, aspects of the operations of 720 may be performed by a wet processing tool.

Figure 8:
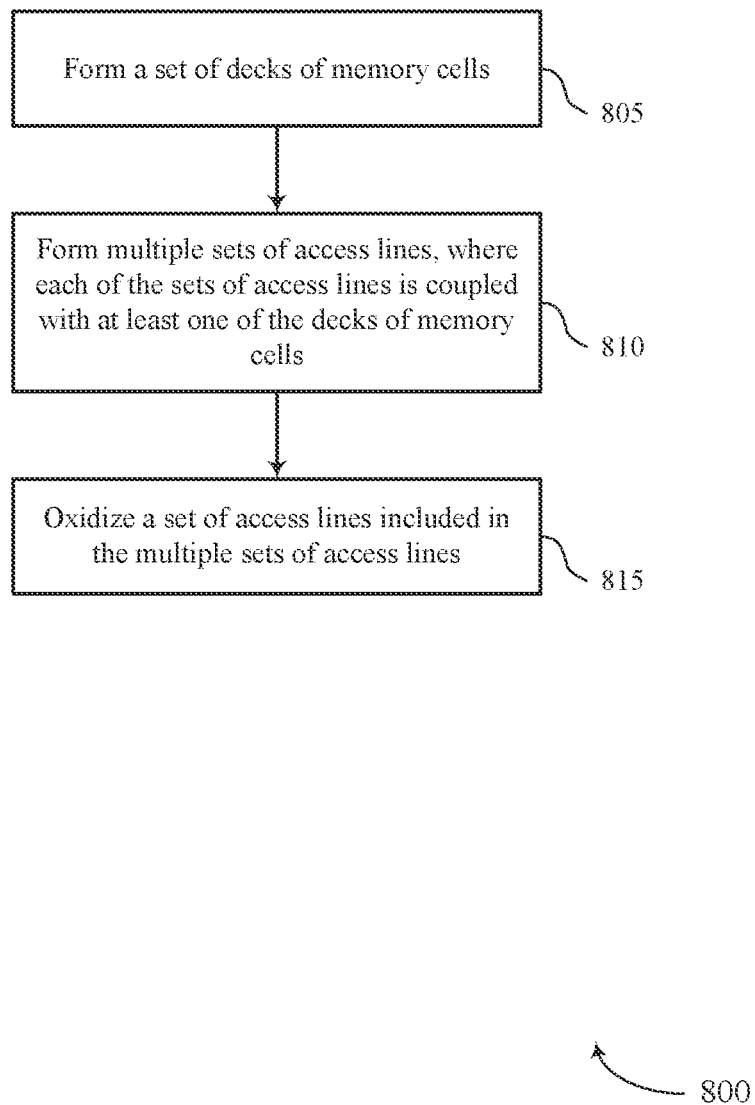
FIG. 8 illustrates a flowchart illustrating a method that supports configuring resistivity for lines in a memory array in accordance with examples as disclosed herein.

FIG. 8 shows a flowchart illustrating a method or methods 800 that supports configurable resistivity for lines in a memory device in accordance with aspects of the present disclosure. The operations of method 800 may be implemented by a formation tool, or a dry processing tool, or a wet processing tool, or their components as described herein.

At 805, a set of decks of memory cells may be formed. The operations of 805 may be performed according to the methods described herein. In some examples, aspects of the operations of 805 may be performed by a formation tool.

At 810, multiple sets of access lines may be formed, where each of the sets of access lines is coupled with at least one of the decks of memory cells. The operations of 810 may be performed according to the methods described herein. In some examples, aspects of the operations of 810 may be performed by a formation tool.

At 815, a set of access lines included in the multiple sets of access lines may be oxidized. The operations of 815 may be performed according to the methods described herein. In some examples, aspects of the operations of 815 may be performed by a wet processing tool or a dry processing tool.

In some examples, an apparatus as described herein may perform a method or methods, such as the method 800. The apparatus may include features or means for forming a set of decks of memory cells, forming multiple sets of access lines, where each of the multiple sets of access lines is coupled with at least one of the decks of memory cells, and oxidizing a set of access lines included in the multiple sets of access lines.

Some examples of the method 800 and the apparatus described herein may further include operations, features, or means for oxidizing a second set of access lines included in the multiple sets of access lines. In some examples, oxidizing the set of access lines includes forming, within each access line of the set, a respective first layer of metal oxide that has a first thickness, and oxidizing the second set of access lines includes forming, within each access line of the second set, a respective second layer of metal oxide that has a second thickness.

Some examples of the method 800 and the apparatus described herein may include operations, features, or means for oxidizing the set of access lines based on exposing the set of access lines to plasma including oxygen or exposing the set of access lines to hydrogen peroxide.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first deck of memory cells coupled with a first set of access lines, where the first set of access lines each include metal oxide having a first thickness, and a second deck of memory cells above the first deck of memory cells, where the second deck of memory cells are coupled with a second set of access lines, and where the second set of access lines each include metal oxide having a second thickness.

In some examples, the first thickness may be greater than the second thickness.

In some examples, the first set of access lines may each include metal having a third thickness underneath the metal oxide having the first thickness, and the second set of access lines may each include metal having a fourth thickness underneath the metal oxide having the second thickness. In some examples, the fourth thickness may be greater than the third thickness.

In some examples, the first set of access lines and the second set of access lines may each include tungsten, and the metal oxide may include tungsten oxide.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims. "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
    a first deck of memory cells coupled with a first set of access lines, wherein the first set of access lines each comprise a first resistivity based at least in part on a metal oxide of the first set of access lines having a first thickness; and
    a second deck of memory cells above the first deck of memory cells, wherein the second deck of memory cells is coupled with a second set of access lines, and wherein the second set of access lines each comprise a second resistivity based at least in part on a metal oxide of the second set of access lines having a second thickness.

2. The memory device of claim 1, wherein the first thickness is greater than the second thickness.

3. The memory device of claim 1, wherein:
    the first set of access lines each comprise metal having a third thickness underneath the metal oxide having the first thickness; and
    the second set of access lines each comprise metal having a fourth thickness underneath the metal oxide having the second thickness.

4. The memory device of claim 3, wherein:
    the third thickness comprises an effective thickness of the metal based at least in part on the metal oxide of the first set of access lines having a first thickness; and
    the fourth thickness comprises an effective thickness of the metal based at least in part on the metal oxide of the second set of access lines having a second thickness.

5. The memory device of claim 3, wherein the fourth thickness is greater than the third thickness.

6. The memory device of claim 2, wherein:
    the first set of access lines and the second set of access lines each comprise tungsten; and
    the metal oxide comprises tungsten oxide.

7. The memory device of claim 1, wherein the first resistivity is greater than the second resistivity.

8. The memory device of claim 1, wherein each line of the first set of access lines comprises a fifth thickness and each line of the second set of access lines comprises a sixth thickness, the fifth thickness based at least in part on the first thickness of the metal oxide and the sixth thickness based at least in part on the second thickness of the metal oxide.

9. The memory device of claim 1, wherein the first set of access lines comprises a first type of metal lines and the second set of access lines comprises a second type of metal lines different from the first type of metal lines.

10. A method, comprising:
    forming a first deck of memory cells coupled with a first set of access lines, wherein the first set of access lines each comprise a first resistivity based at least in part on a metal oxide of the first set of access lines having a first thickness; and
    forming a second deck of memory cells above the first deck of memory cells, wherein the second deck of memory cells is coupled with a second set of access lines, and wherein the second set of access lines each comprise a second resistivity based at least in part on a metal oxide of the second set of access lines having a second thickness.

11. The method of claim 10, further comprising:
    forming the metal oxide having the first thickness; and
    forming the metal oxide having the second thickness, wherein the first thickness is greater than the second thickness.

12. The method of claim 11, further comprising:
    depositing a metal having a third thickness, wherein the metal oxide having the first thickness is formed above the metal having the third thickness; and
    depositing a metal having a fourth thickness, wherein the metal oxide having the second thickness is formed above the metal having the fourth thickness.

13. The method of claim 12, wherein:
    the third thickness comprises an effective thickness of the metal based at least in part on the metal oxide of the first set of access lines having a first thickness; and
    the fourth thickness comprises an effective thickness of the metal based at least in part on the metal oxide of the second set of access lines having a second thickness.

14. The method of claim 12, wherein the fourth thickness is greater than the third thickness.

15. The method of claim 10, wherein:
    the first set of access lines and the second set of access lines each comprise tungsten; and
    the metal oxide comprises tungsten oxide.

16. The method of claim 10, wherein the first resistivity is greater than the second resistivity.

17. A memory device, comprising:
    a first deck of memory cells coupled with a first set of access lines comprising a first resistivity formed by:
        forming a metal oxide having a first thickness, wherein the first set of access lines comprise the first resistivity based at least in part on the metal oxide of the first set of access lines having the first thickness; and
    a second deck of memory cells above the first deck of memory cells, wherein the second deck of memory cells is coupled with a second set of access lines comprising a second resistivity formed by:

forming the metal oxide having a second thickness, wherein the first thickness is greater than the second thickness and wherein the second set of access lines comprise the second resistivity based at least in part on the metal oxide of the second set of access lines having the second thickness.

* * * * *